(12) United States Patent
Sander

(10) Patent No.: US 6,690,233 B2
(45) Date of Patent: Feb. 10, 2004

(54) EFFICIENT, PRECISE RF MODULATION USING MULTIPLE AMPLIFIER STAGES

(75) Inventor: Wendell B. Sander, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/746,530

(22) Filed: Dec. 21, 2000

(65) Prior Publication Data

US 2002/0079962 A1 Jun. 27, 2002

(51) Int. Cl.[7] .................... H03F 3/68; H03F 3/217; H03F 3/04
(52) U.S. Cl. .................. 330/124 R; 330/207 A; 330/251; 330/297
(58) Field of Search ................. 330/124 R, 207 A, 330/251, 10, 297

(56) References Cited

U.S. PATENT DOCUMENTS

| | | | | |
|---|---|---|---|---|
| 4,686,448 A | * | 8/1987 | Jones et al. ................. | 323/212 |
| 6,054,896 A | * | 4/2000 | Wright et al. ............... | 330/149 |
| 6,285,251 B1 | * | 9/2001 | Dent et al. ................. | 330/124 R |

* cited by examiner

*Primary Examiner*—Patricia Nguyen
(74) *Attorney, Agent, or Firm*—Thelen Reid & Priest LLP

(57) ABSTRACT

The present invention, generally speaking, provides a highly efficient RF power amplifier having a large output dynamic range. The amplifier avoid the large power dissipation that occurs in the LINC combiner at lower output levels. In general, this is achieved by using power-controlled switch-mode power amplifiers to vary output power at large power outputs, and reverting to LINC only at low output powers. Thus the present invention achieves the desirable combination of high efficiency at all output powers, while maintaining the fine output power control of the LINC method. More particularly, the power amplifier is based on a highly efficient structure in which amplitude modulation/power control of the output of an RF amplifier is achieved by operating the amplifier in switch mode and varying the power supply of the amplifier, as described more fully in U.S. patent application Ser. No. 09/637,269 entitled High-Efficiency Modulating RF Amplifier, filed Aug. 10, 2000 and incorporated herein by reference. Such an amplifier behaves quite linearly at high power but may exhibit non-linearity at lower output powers. Good linearity throughout a wide dynamic range, and particularly at low output power, may be achieved by phasing and combining the outputs of two (or more) such amplifiers. At high and medium power, the outputs are combined in-phase, allowing for low-loss, high-efficiency operation. At low power, the outputs are phased such that power subtraction occurs. In this manner, each amplifier may be operated at a power level that exhibits good linearity while producing an output signal of a lower power level that would normally fall within a region of substantial non-linearity.

19 Claims, 5 Drawing Sheets

EFFICIENT, PRECISE RF MODULATION USING MULTIPLE AMPLIFIER STAGES

BACKGROUND OF THE INVENTION

1. Field of the Invention

The present invention relates to radio frequency (RF) amplifiers.

2. State of the Art

Presently, much attention and engineering effort is being focused in the area of wideband cellular telephony, i.e., "third generation" (3G) cellular systems. Web-enabled telephones will increasing rely on such systems to deliver added value and make the mobile Web experience more compelling. An example of a wideband cellular technology is EDGE, a high-speed air interface that may be used within the existing GSM cellular infrastructure. Presently, the modulation used by EDGE is a variant of 8PSK, i.e., eight-level Phase Shift Keying. The data constellation in such a modulation scheme is substantially more complex than that used in current second-generation systems. The data constellation itself entails a dynamic range of 18 dB of transmit power. Power level adjustment requires an additional 27 dB of dynamic range, for a total of 45 dB dynamic range. For other 3G signals, such as UMTS, transmitter dynamic range exceeds 90 dB.

In the case of conventional linear power amplifiers, achieving such dynamic range is relatively straight-forward. Linear power amplifiers, however, exhibit very low efficiency, particularly at middle and low output power levels. For 3G cell phones, efficiency is a paramount consideration.

Furthermore, in EDGE and similar 3G technologies, the transition of the signal vector from one point in the data constellation to another point in the data constellation is required to pass near to the signal origin, defined by zero or near-zero output power. Precise control of amplitude and phase trajectories in this manner becomes problematic over the wide dynamic range described.

The desire for efficient power amplification has resulted in techniques such as the LINC (LInear amplification with Nonlinear Components) power amplifier technique. In the LINC power amplification technique (described, for example, in U.S. Pat. No. 5,990,738, incorporated herein by reference), a signal which has amplitude variations is generated by combining two signals which vary only in their relative phases. The vector sum of the two signals can represent any amplitude and phase.

Referring more particularly to FIG. 1, a LINC amplifier 10 amplifies two or more constant amplitude signals, which represent an input signal to be amplified. The LINC amplifier uses a signal separator 11 to split the input 12 into the two components 13, 14, which are constant amplitude, phase varying components. The LINC amplifier may be supplied a complex baseband digitally sampled signal 12. The baseband signals 12 can be a representation of multiple modulated carriers using any modulations. For simplicity, various details such as the need to convert from baseband to a higher frequency and the need to convert from digital into analog have been omitted.

Since the power stages 15, 16 do not have to deal with amplitude variations, it is possible to build an amplifier which will amplify signals linearly by using the two phase and frequency modulated components. The nonlinearity of the amplifiers is no longer a problem in the amplification of multiple signals or those containing amplitude variations, because the constant amplitude of the two components 13, 14 become constant amplified amplitudes as they are amplified by amplifiers 15, 16, while the phase of the components passes through the amplifiers with a constant shift. Although the nonlinear amplifiers produce distortion signals at multiples of the carrier frequency, these can be filtered off. The output signals from 15, 16 are vectorially combined in combiner 17 to produce the final output signal 18.

The vector diagram of FIG. 2, including FIGS. 2(a)–(e), illustrates the manner in which the output signals of FIG. 1 vary over time to achieve a particular signal transition. Here, for purposes of illustration, the LINC component signal vectors (solid lines) and the resultant signal vector (dotted line) are sampled along an example transition within a 16-QAM constellation. The resultant signal (central vector) is assumed to progressively decrease during a portion of the transition and then progressively increase to again reach the starting magnitude. As the resultant becomes small, since the signal components are of constant magnitude, the phase angle between the signal components approaches 180 degrees. In general, LINC requires phase shifters operable over a wide range.

In LINC, because the two component signals are constant amplitude, non-linear amplifiers may be used, Furthermore, because more efficient amplifier operation is achieved using non-linear (as opposed to linear) amplifiers, considerable efficiency gain may be achieved in the power stages. Nevertheless, in many instances, the two signals are in an antiphase or near antiphase relationship, with the result that most of the signal power is dissipated in the signal combiner. Also, in some instances, the signals may be required to undergo rapid phase rotation, substantially increasing component-signal bandwidth. For example, FIG. 3 is a graph illustrating the signal bandwidth effects of the signal transition of FIG. 2. An example signal transition may exhibit the frequency profile of the middle solid line. The advancing LINC component signal (triangles) begins with a higher frequency offset than the intended signal, and continues on to have a higher peak frequency than for the original signal. The following LINC component (squares) starts actually rotating in the opposite direction (negative frequency shift). Following the midpoint of the signal transition, the roles of the two LINC component signal reverses. Clearly, in an amplitude and angle modulated signal such as this, the block generating the LINC component signals must have greater bandwidth than the incoming signal alone. This increased bandwidth requirement can be a problem for wide bandwidth input signals.

Future 3G cell phones will require power amplifiers that exhibit high efficiency and a large dynamic range consistent with wideband operation, as well as precise control of amplitude and phase trajectories. In particular, amplifiers are needed that avoid the large power dissipation that occurs in the LINC combiner at lower output levels.

SUMMARY OF THE INVENTION

The present invention, generally speaking, provides a highly efficient RF power amplifier having a large output dynamic range. The amplifier avoid the large power dissipation that occurs in the LINC combiner at lower output levels. In general, this is achieved by using power-controlled switch-mode power amplifiers to vary output power at large power outputs, and reverting to LINC only at low output powers. Thus the present invention achieves the desirable combination of high efficiency at all output powers, while maintaining the fine output power control of the LINC method. More particularly, the power amplifier is based on a highly efficient structure in which amplitude modulation/power control of the output of an RF amplifier is achieved by operating the amplifier in switch mode and varying the power supply of the amplifier, as described more fully in U.S. patent application Ser. No. 09/637,269 entitled High-Efficiency Modulating RF Amplifier, filed Aug. 10, 2000 and incorporated herein by reference. Such an amplifier behaves quite linearly at high power but may exhibit non-linearity at lower output powers. Good linearity throughout a wide dynamic range, and particularly at low output power, may be achieved by phasing and combining the outputs of two (or more) such amplifiers. At high and medium power, the outputs are combined in-phase, allowing for low-loss, high-efficiency operation. At low power, the outputs are phased such that power subtraction occurs. In this manner, each amplifier may be operated at a power level that exhibits good linearity while producing an output signal of a lower power level that would normally fall within a region of substantial non-linearity.

BRIEF DESCRIPTION OF THE DRAWING

The present invention may be further understood from the following description in conjunction with the appended drawing. In the drawing:

FIG. 2, including

FIG. 7, including FIG. 8, including

DETAILED DESCRIPTION OF THE PREFERRED EMBODIMENTS

Figure 4:
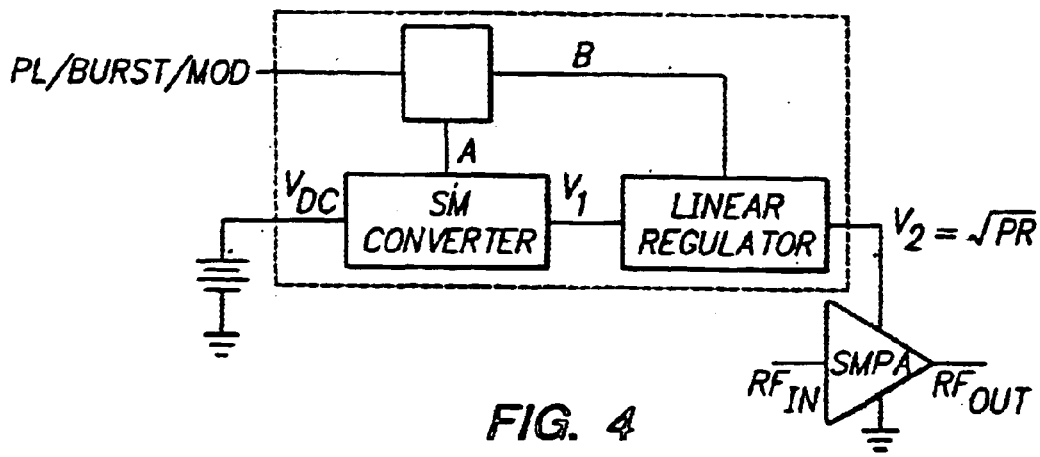
FIG. 4 is a block diagram of a power amplifier that may be used with the present invention.

Referring now to FIG. 4, a block diagram is shown of a power amplifier that may be used in the present invention. A switch-mode (or saturated) nonlinear amplifier has applied to it a voltage produced by a power control stage. In an exemplary embodiment, the voltage V applied to the non-linear amplifier is controlled substantially in accordance with the equation $$V=\sqrt{PR}$$

where P is the desired power output level of the amplifier and R is the resistance of the amplifier. In the case of a switch-mode or saturated amplifier, the resistance R may be regarded as constant. The power control stage receives a DC input voltage, e.g., from a battery, and receives a power level control signal and outputs a voltage in accordance with the foregoing equation.

Figure 5:
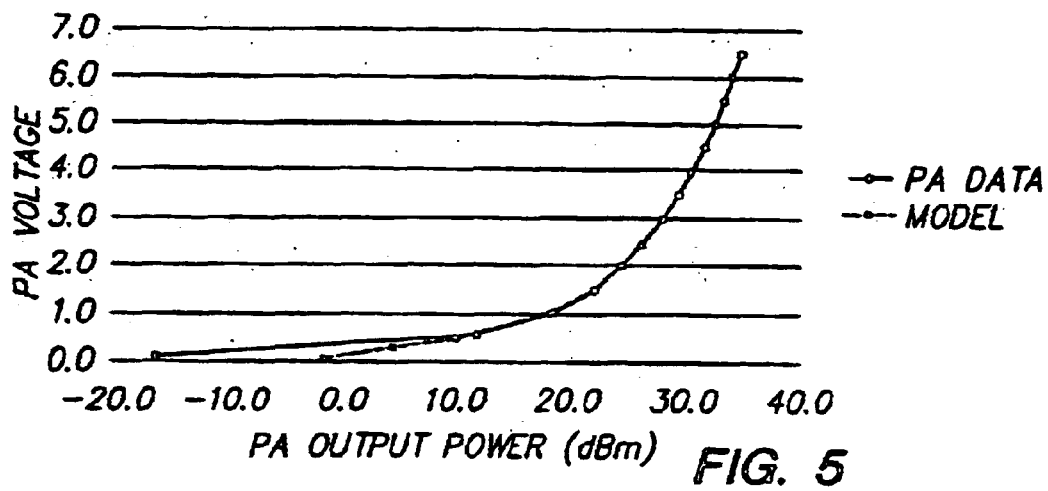
FIG. 5 is a plot comparing saturated Class AB power amplifier output power versus operating voltage with the mathematical model $V=\sqrt{PR}$.

The efficacy of directly controlling output power of nonlinear amplifiers over a wide dynamic range by solely varying the operating voltage is demonstrated by FIG. 5, showing a plot comparing saturated Class AB power amplifier output power versus operating voltage with the mathematical model $V=\sqrt{PR}$.

Referring again to FIG. 4, a power control circuit in accordance with an exemplary embodiment of the invention is shown. A power control stage includes a switch-mode converter stage and a linear regulator stage connected in series. The switch-mode converter may be a Class D device, for example, or a switch-mode power supply (SMPS). The switch-mode converter efficiently steps down the DC voltage to a voltage that somewhat exceeds but that approximates the desired power-amplifier operating voltage level. That is, the switch-mode converter performs an efficient gross power level control. The switch-mode converter may or may not provide sufficiently fine control to define ramp portions of a desired power envelope.

The linear regulator performs a filtering function on the output of the switch-mode converter. That is, the linear regulator controls precise power-envelope modulation during a TDMA burst, for example. The linear regulator may or may not provide level control capabilities like those of the switch-mode converter.

Note that, depending on the speed of the switch-mode converter and the linear regulator, the power control stage may be used to perform power control and/or amplitude modulation. A control signal PL/BURST is input to a control block, which outputs appropriate analog or digital control signals for the switch-mode converter and the linear regulator. The control block may be realized as a ROM (read-only memory) and/or a DAC (digital to analog converter).

The same structure may be used to perform amplitude modulation in addition to power and burst control. Full control of the output signal power level (average power of the signal) is retained. Incorporation of amplitude modulation on a phase-modulated signal, though it complicates the signal generation method, is often desirable since such signals may, and often do, occupy less bandwidth than purely phase-modulated signals. Polar modulation structures may also use the high-efficiency amplifier of the type described thus far.

Figure 6:
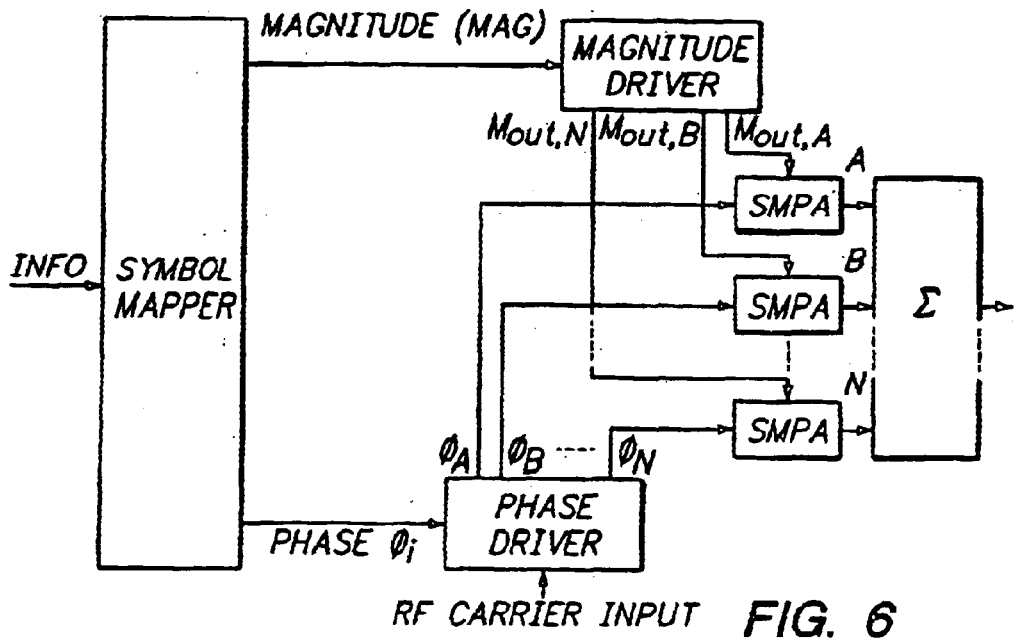
FIG. 6 is a diagram of a power amplifier in which the output signals of multiple amplifiers are phased and combined.

Referring now to FIG. 6, a block diagram is shown of an RF power amplifier in accordance with one embodiment of the present invention. The high power, high efficiency, RF amplifier includes multiple switch mode power amplifier (SMPA) blocks, each block being realized as shown in FIG. 4, for example. Separate control signals for each of the SMPA blocks are generated by a magnitude driver in response to a magnitude input signal. Also, separate control signals for each of the SMPA blocks are generated by a phase driver in response to a phase input signal. Output signals of the SMPA blocks are summed to form a single resultant output signal.

Figure 7A:
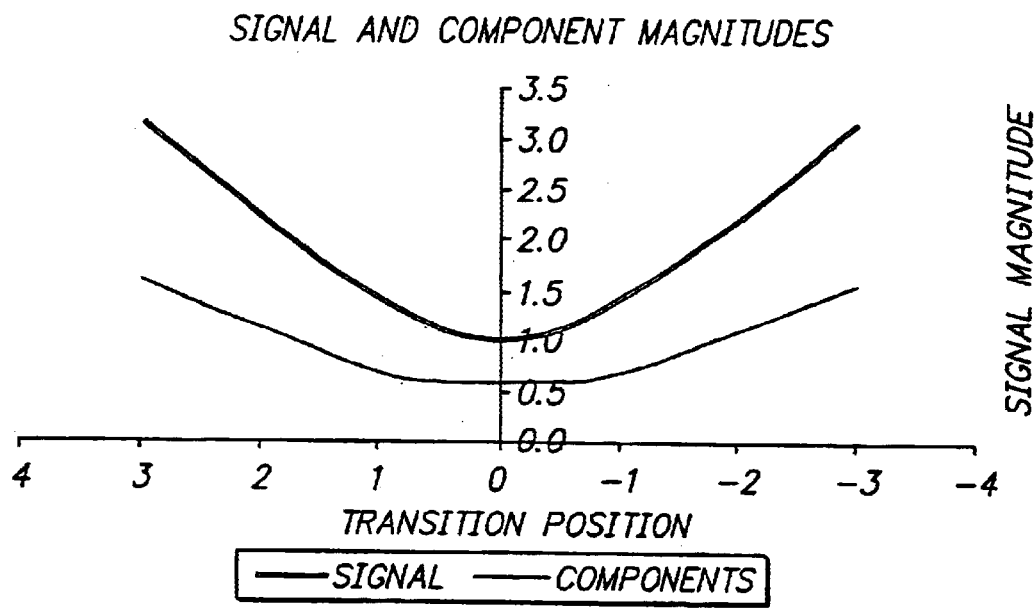
FIGS. 7(a)–(b), is a vector diagram illustrating a manner in which the output signals of FIG. 6 combine.
Figure 7B:
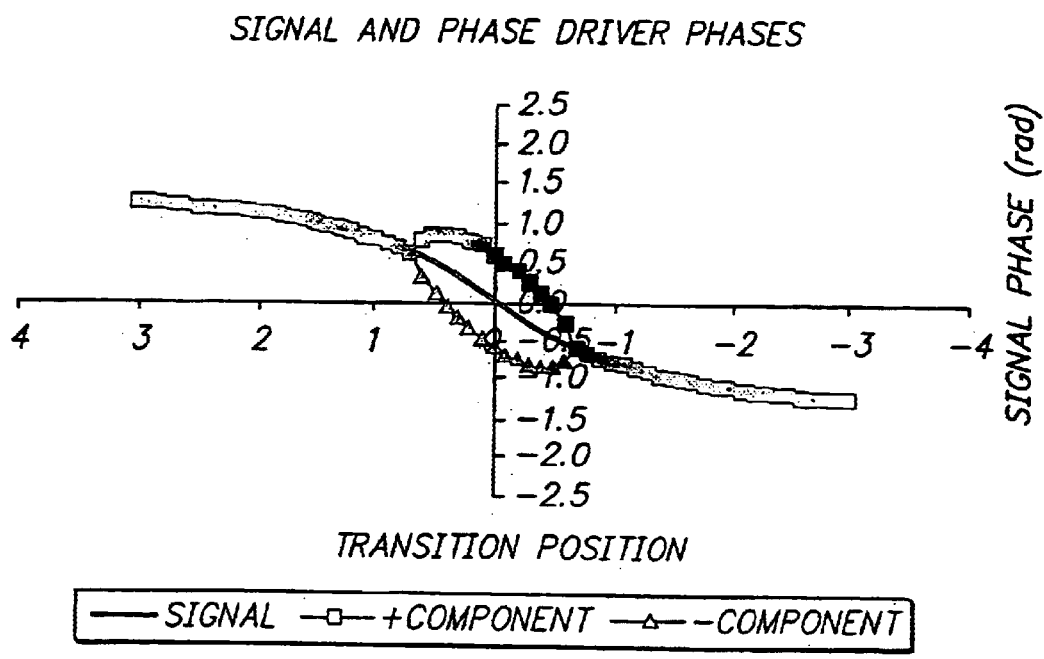
Figure 8A:
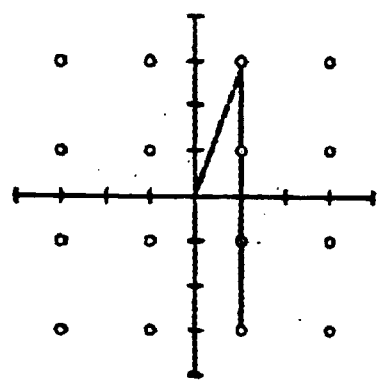
FIGS. 8(a)–(e), is a vector diagram illustrating the manner in which the output signals of FIG. 6 vary over time to achieve a particular signal transition.
Figure 8B:
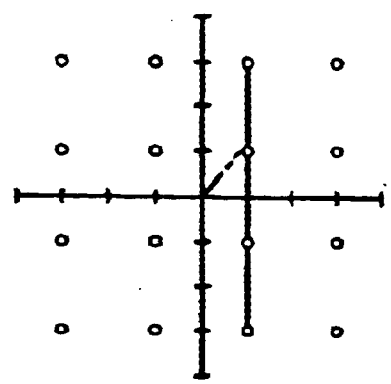
Figure 8C:
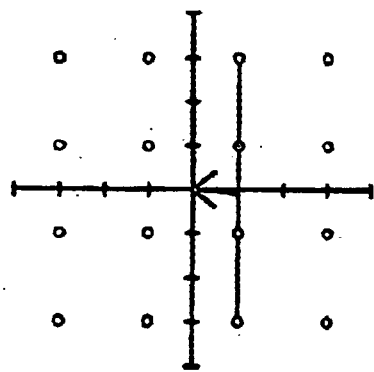
Figure 8D:
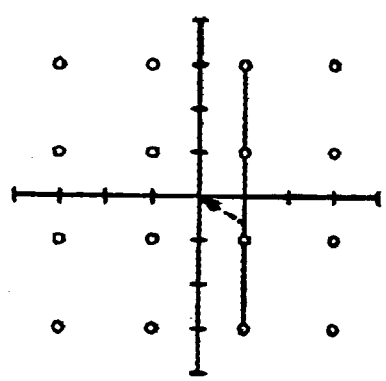
Figure 8E:
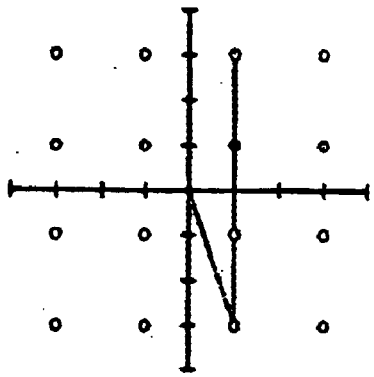

The general drive strategy for controlling the amplifier of FIG. 6 may be appreciated with reference to FIG. 7, including FIGS. 7(a)–(b), illustrating the case of two SMPA blocks. The magnitudes of the component signals are variable for large output signal magnitudes. The phase of both component signals are correspondingly set to equal the desired phase of the output signal. For smaller output signal magnitudes, the component signal magnitudes are fixed, and the phases are varied similar to the LINC technique. In other words, within some range of maximum power of the resultant output signal (say, a 20–30 dB range), the SMPA blocks are controlled to have the same phase (but possibly varying magnitudes). Only at power levels below this range are the output signals of the respective SMPA blocks phased such that the magnitude of the vector sum is less than the scalar sum of the respective magnitudes.

Figure 1:
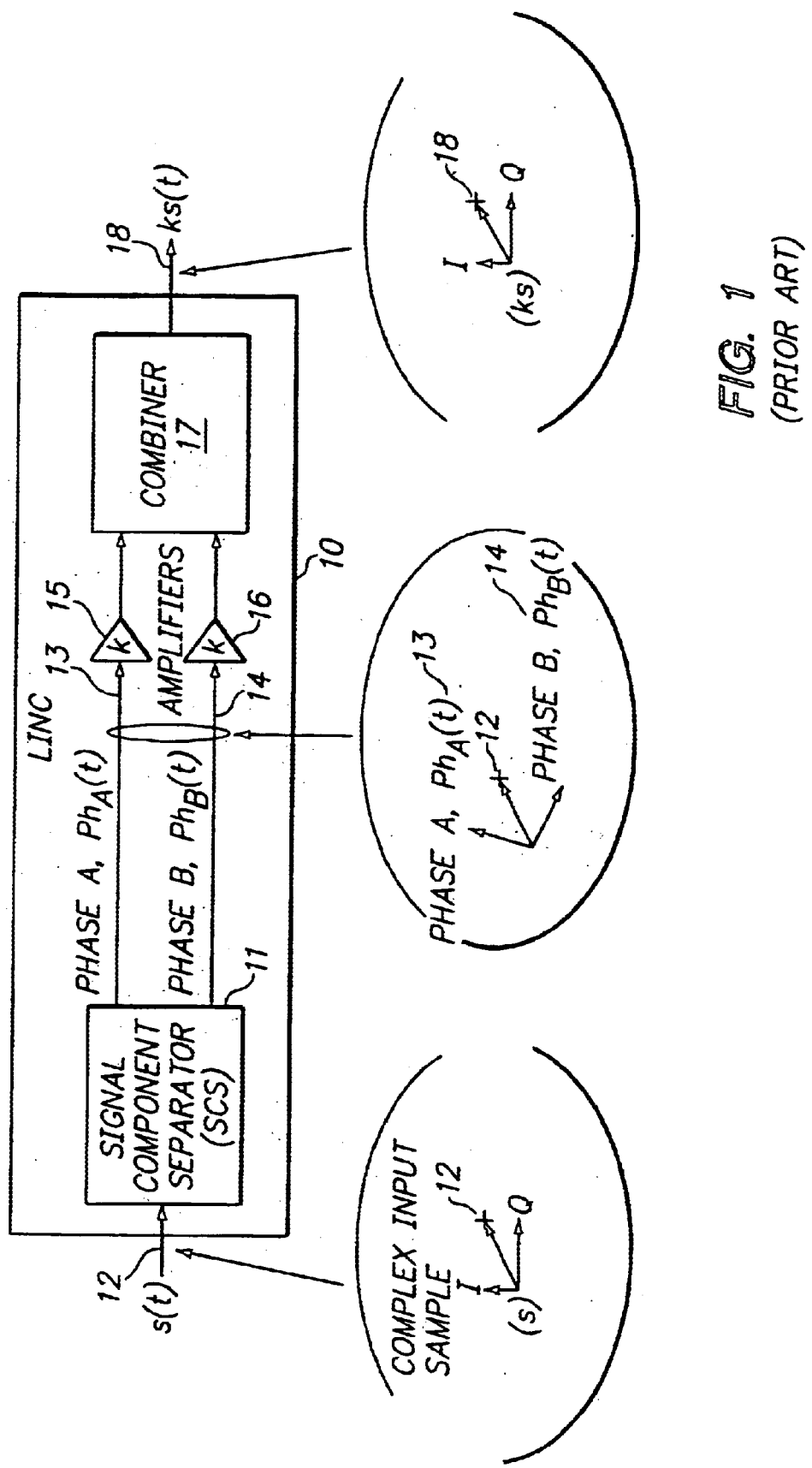
FIG. 1 is a block diagram of a prior art LINC amplifier structure.
Figure 2A:
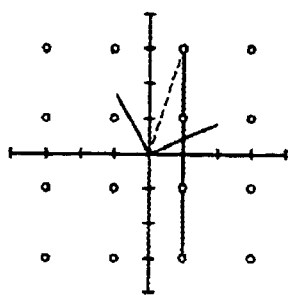
FIGS. 2(a)–(e), is a vector diagram illustrating the manner in which the output signals of FIG. 1 vary over time to achieve a particular signal transition.
Figure 2B:
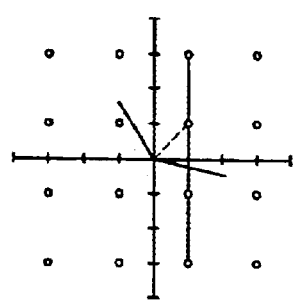
Figure 2C:
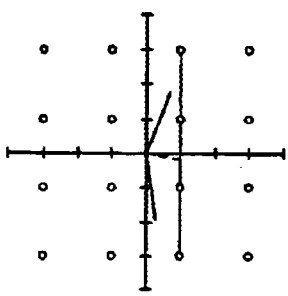
Figure 2D:
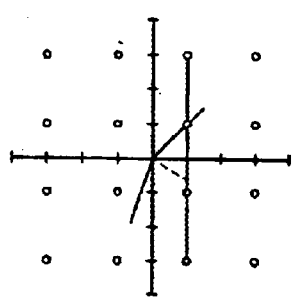
Figure 2E:
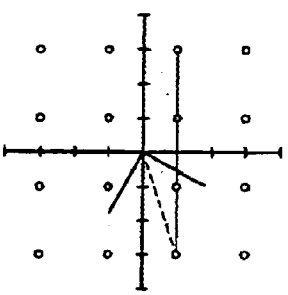
Figure 3:
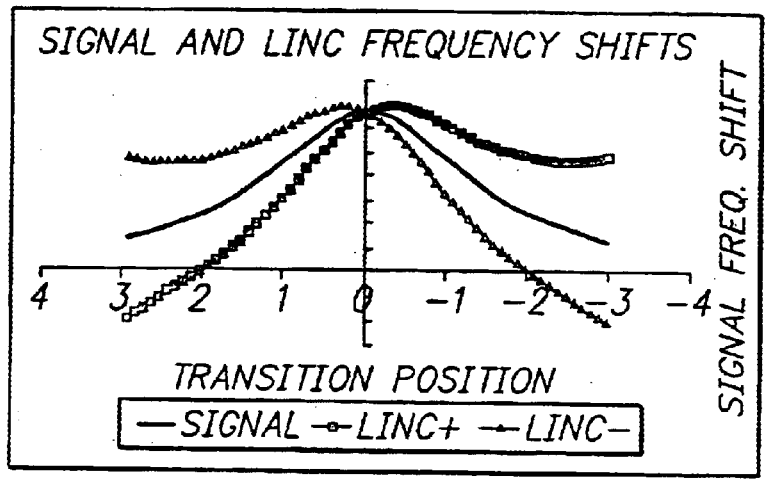
FIG. 3 is a graph illustrating the signal bandwidth effects of the signal transition of FIG. 2.

The same example transition (FIG. 2 and FIG. 3) is considered in FIG. 7. It may be seen in FIG. 7(a) that the magnitude of the signal components is generally half the magnitude of the desired signal so long as the component magnitude remains above an established lower limit. In this range, the phases of the components remain the same (FIG. 7(b)). When the lower component magnitude limit is encountered, the component magnitudes are not decreased further. Instead, the phases of the components diverge (FIG. 7(b)) such that a desired resultant is achieved. When the component magnitudes rise above the lower limit, their phases again reach coincidence.

Hence, in an exemplary embodiment, the amplifier of FIG. 6 may be controlled in accordance with the following control strategy:

If MAG<MIN, $M_{out,k}$=MIN
else $M_{out,k}$=MIN/2;
If MAG>MIN, $\phi_k=\phi_i$
else $\phi_A=\phi_i+\cos^{-1}$(MAG/MIN), $\phi_B=\phi_i-\cos^{-1}$(MAG/MIN).

Referring to FIG. 8, the contrast between the technique of the present invention and the prior art may be better appreciated. Again, the case of two SMPA blocks is illustrated. LINC component signal vectors (solid), in accordance with the techniques of the present invention, and the resultant signal vector (dotted) are shown, sampled along the same example transition within the 16-QAM constellation. At the outset of the transition, the signal components are aligned in phase. They remain aligned during a first portion of the rotation during which the magnitudes of the resultant and the signal components are decreasing, until such point in time as threshold low magnitude is reached. Beyond this threshold low magnitude, the magnitudes of the signal components are no longer decreased. Instead, the phase angle between the signal components is increased. That is, taking as reference the speed of rotation of the resultant, the speed of rotation of one of the signal components increases while the speed of rotation of the other of the signal components decreases. During a second portion of the rotation, the opposite process occurs. As the desired magnitude of the resultant further increases, the magnitudes of the signal components are increased accordingly.

Note that when the LINC mode is invoked, the component signals are significantly smaller. This directly corresponds to significantly reduced power dissipation in the LINC combiner. Similarly, when the two signal components are in-phase for larger output signal magnitudes, combiner losses are also minimized—as if the LINC system were always operating at maximum output power.

Although it may be advantageous, in the case of two amplifiers, to have the capability of varying the magnitudes of the output signals of both amplifiers, in other embodiments, the output signal of one of the amplifiers may be fixed in magnitude. Furthermore, other types of amplifiers may be used instead of switch mode power amplifiers, e.g., saturated class A or class AB amplifiers, class C amplifiers, etc.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An RE power amplifier, comprising:
    a first amplifier block producing a variable magnitude output signal;
    a further amplifier block; and
    circuitry for controlling the magnitude of the variable magnitude output signal and for phasing and combining output signals of the amplifier blocks by varying a phase difference between the output signals throughout a range such that, at higher desired output power levels, the output signals combine substantially in-phase, and at lower desired output power levels, the output signals combine less in-phase.

2. The apparatus of claim 1, wherein said first amplifier block comprises:
    an amplifier stage operated in switch mode; and
    circuitry for varying the power of an output signal of the amplifier stage by varying a supply voltage applied to the amplifier stage.

3. The apparatus of claim 2, wherein said further amplifier block comprises:
    an amplifier stage operated in switch mode; and
    circuitry for varying the power of an output signal of the amplifier stage by varying a supply voltage applied to the amplifier stage.

4. The apparatus of claim 1, wherein said circuitry for controlling and for phasing and combining comprises:
    a magnitude controller responsive to a magnitude input signal for producing magnitude drive signals for the first amplifier block and the further amplifier block;
    a phase controller responsive to a phase input signal for producing phase drive signals for the first amplifier block and the further amplifier block; and
    a combiner for combining output signals of the first amplifier block and the further amplifier block.

5. The apparatus of claim 4, wherein the magnitude controller varies the magnitude drive signals in proportional relationship to the magnitude input signal during such time as the magnitude drive signals exceed a threshold level.

6. The apparatus of claim 5, wherein the magnitude controller departs from said proportional relationship when adhering to said proportional relationship would cause the magnitude drive signals fall below the threshold level.

7. The apparatus of claim 6, wherein the magnitude controller holds the magnitude drive signals substantially constant at said threshold level when adhering to said proportional relationship would cause the magnitude drive signals fall below the threshold level.

8. The apparatus of claim 4, wherein the phase controller produces multiple substantially identical phase drive signals during such time as the magnitude drive signals exceed a threshold level.

9. The apparatus of claim 8, wherein the phase controller produces multiple substantially different phase drive signals during such time as the magnitude drive signals do not exceed the threshold level.

10. The apparatus of claim 9, wherein the phase controller produces multiple phase drive signals calculated according to phase offsets from a desired output signal phase.

11. The apparatus of claim 10, wherein said phase offsets are calculated in accordance with a trigonometric function having as its argument a ratio of the magnitude input signal and the threshold.

12. A method of operating an RE power amplifier having a plurality of amplifier blocks including a first amplifier block producing a variable magnitude output signal and a further amplifier block, the method comprising:

controlling the magnitude of the variable magnitude output signal;

at higher desired output power levels, phasing and combining output signals of the amplifier blocks such that the output signals combine substantially in-phase; and at lower desired output power levels, phasing and combining output signals of the amplifier blocks by varying a phase difference between the output signals throughout a range such that the output signals combine less in-phase.

13. The method of claim 12, further comprising:

operating an amplifier stage of the first amplifier block in switch mode; and varying the magnitude of the variable magnitude output signal varying a supply voltage applied to the amplifier stage of the first amplifier block.

14. The method of claim 13, further comprising:

operating an amplifier stage of the further amplifier block in switch mode; and varying the magnitude of an output signal of the further amplifier stage by varying a supply voltage applied to the amplifier stage of the further amplifier block.

15. The method of claim 12, wherein the further amplifier block produces a variable magnitude output signal.

16. The method of claim 15, wherein magnitudes of the variable magnitude output signals of the first amplifier block and the further amplifier block are controlled substantially as follows:

If $MAG<MIN$, $M_A=M_B=MIN$ else $M_A=M_B=MIN/2$;

where MAG is a desired output power level, MIN is a threshold output power level, $M_A$ is the magnitude of the variable magnitude output signal of the first amplifier block, and $M_B$ is the magnitude of the variable magnitude output signal of the further amplifier block.

17. The method of claim 16, wherein output signals of the amplifier blocks are phased substantially as follows:

If $MAG>MIN$, $\phi_A=\phi_B=\phi_i$ else $\phi_A=\phi_i+\cos^{-1}(MAG/MIN)$, $\phi_B=\phi_i-\cos^{-1}(MAG/MIN)$;

where $\phi_i$ is a desired output signal phase.

18. The method of claim 15, wherein output signals of the amplifier blocks are phased substantially as follows:

If $MAG>MIN$, $\phi_A=\phi_B=\phi_i$ else $\phi_A=\phi_i+\cos^{-1}(MAG/MIN)$, $\phi_B=\phi_i-\cos^{-1}(MAG/MIN)$;

where MAG is a desired output power level, MIN is a threshold output power level, and $\phi_i$ is a desired output signal phase.

19. The method of claim 18, wherein magnitudes of the variable magnitude output signals of the first amplifier block and the further amplifier block are controlled substantially as follows:

If $MAG<MIN$, $M_A=M_B=MIN$ else $M_A=M_B=MIN/2$;

where $M_A$ is the magnitude of the variable magnitude output signal of the first amplifier block, and $M_B$ is the magnitude of the variable magnitude output signal of the further amplifier block.

* * * * *

UNITED STATES PATENT AND TRADEMARK OFFICE
CERTIFICATE OF CORRECTION

PATENT NO. : 6,690,233 B2  
DATED : February 10, 2004  
INVENTOR(S) : Wendell B. Sander It is certified that error appears in the above-identified patent and that said Letters Patent is hereby corrected as shown below:

Column 2,  
Line 10, replace "(*a*)-(e)" with -- A-E --.

Column 3,  
Lines 30 and 47, replace "(a)-(e)" with -- A-E --.  
Line 44, replace "(a)-(b)" with -- A-B --.

Column 4,  
Line 60, replace "(a)-(b)" with -- A-B --.

Column 5,  
Line 8, replace "(a)" with -- A --.  
Line 8, replace "(b)" with -- B --. (both occurrences)

Signed and Sealed this

Thirteenth Day of July, 2004

JON W. DUDAS  
*Acting Director of the United States Patent and Trademark Office*